July 4, 1972 M. R. GOLDRICK ET AL 3,674,492

LAMINAR PHOTOMASK

Filed Dec. 9, 1970

INVENTORS M.R. GOLDRICK
R.E. KERWIN
J.G. SKINNER
BY Edward M. Fink
ATTORNEY 3,674,492

LAMINAR PHOTOMASK

Michael Richard Goldrick, Maplewood, Robert Eugene Kerwin, Westfield, and John George Skinner, Basking Ridge, N.J., assignors to Bell Telephone Laboratories, Incorporated, Murray Hill, N.J.

Filed Dec. 9, 1970, Ser. No. 96,452
Int. Cl. G03c 1/76
U.S. Cl. 96—68 5 Claims

ABSTRACT OF THE DISCLOSURE

A high speed, high resolution laminar photomask is obtained by coating a transparent substrate member with chromium or iron oxide, a photoresist and a thin film of a high resolution photographic emulsion having a thickness of the order of 2.0 micrometers. The resultant photomask is found to enhance the speed of conventional photoresists and to increase the effective field of view of projection systems by reducing the required image modulation.

BACKGROUND OF THE INVENTION

(1) Field of the invention

This invention relates to a technique for the fabrication of a high speed, high resolution laminar photomask designed for use in photoresist and photolithographic processes and to the resultant photomask.

(2) Description of the prior art

Numerous procedures involving chemical processing are presently available for preparing a relief image within a photoresist layer, contact printing and projection printing being prime examples of such procedures.

Although contact printing is the most commonly used technique for effecting this end, it has long been recognized as suffering from an inherent deficiency of mask and/or photoresist layer damage which results from contact therebetween. Additionally, in the contact printing process it is often difficult to obtain absolute contact between the mask and the resist over the entire area of interest, so resulting in the formation of air gap and production of poor quality images. An alternative to contact printing is the so-called "near-contact printing" technique in which a small air gap is deliberately created between the mask and the photoresist layer to avoid contact damage. This gap, however, reduces the image quality of narrow lines compared to that obtained by contact printing.

In order to overcome the inherent limitations of contact printing, workers in the art focused their interest upon projection printing which avoids the contact damage problem. Unfortunately, this technique is not entirely satisfactory due to the limited field of view and the fact that modulation of the image at the surface of the photo-resist employed is not as large as that normally obtained by contact printing, modulation being a measure of the quality of the image. It has been recognized that the solution to these various prior art problems is the development of a photoresist manifesting a higher sensitivity and requiring less image modulation than those presently available from commercial sources.

SUMMARY OF THE INVENTION

In accordance with the present invention, a technique is described for the fabrication of a novel high speed, high resolution laminar photomask. The inventive photomask includes an iron oxide or chromium coated transparent substrate member having deposited thereon successively a photoresist and a thin layer of a high resolution photographic emulsion. The resultant photomask has been found to increase the effective speed of the photoresist and to enhance the effective field of view of projection systems by reducing the required image modulation while minimizing damage to photoresist surfaces.

BRIEF DESCRIPTION OF THE DRAWING

The invention will be more readily understood by reference to the following detailed description taken in conjunction with the accompanying drawing wherein.

DETAILED DESCRIPTION

Figure 1A:
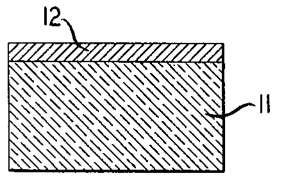
FIGS. 1A through 1C are front elevational views in cross-seection of the laminar photomask of the invention in successive stages of fabrication.

A general outline of a method suitable for use in the manufacture of a laminar photomask in accordance with the invention is set forth below. Certain operating parameters and ranges as well as the type of material employed are indicated.

The substrate member of the present invention may be selected from among any of the well-known transparent base materials such as glass, quartz and the like bearing a thin film ranging in thickness from 0.07 to 0.15 micrometer of either chromium or iron oxide. In the case of the former, the exposed photoresist in the ultimate assembly serves to control etching and results in a metal-on-glass mask, whereas in the latter case a semitransparent iron oxide mask is obtained. The ranges of thickness of the noted films are dictated by considerations relating to the optical density of the masking material (Cr or $Fe_2O_3$) which should be $\geq 1.5$ within the region of spectral sensitivity of photoresists ($300 \leq \lambda \leq 450$ nanometers). However, thickness should be minimized to minimize the relief pattern.

Photoresists suitable in the practice of the present invention manifest high resolution capability and are unaffected either by the emulsion coating to be deposited thereon or by stripping solvents, such as, water and dilute hypochlorous acid which are used to subsequently remove the emulsion layer. All conventional photoresists, except those containing dichromated gelatin, fulfill these requirements, poly(vinyl cinnamate), poly(isoprene) and poly(cresol formaldehyde) being prime examples of satisfactory photoresists. Studies have revealed that the thickness of the photoresist layer should range from 0.2 to 0.8 micrometer, such range being dictated by the thickness versus resolution characteristics of the resist employed and the desired ultimate resolution.

The photographic emulsion amenable to processing herein must be available in liquid form so it can be conveniently coated upon the underlying photoresist layer as, for example, by spin coating or doctor blade coating, and after exposure of the underlying resist, it must be capable of being removed by procedures which do not adversely affect the resist or its subsequent development. The high resolution silver halide in various emulsions employed must be capable of yielding a developed optical density greater than 1.0 in films as thin as two micrometers, in other words, they must manifest a high ratio of silver halide to gelatin in the emulsion. For the purposes of the present invention, the term "high resolution" is defined in terms of granularity and refers to emulsions having a developed grain size less than 0.1 micrometer and it must be capable of a resolution of approximately 500 cycles per millimeter.

The following is an outline of the procedure to be followed in producing a laminar photomask from the above materials.

As indicated, the initial step of the process involves coating the substrate member with a thin layer of either chromium or iron oxide, such layer ranging in thickness from 0.07 to 0.15 micrometer. This end may conveniently be attained by vacuum evaporation techniques or chemical deposition methods which are well known to those skilled in the art.

With reference now to FIG. 1A, there is shown a front elevational view in cross-section of a typical transparent substrate member 11 having deposited thereon a thin film of either chromium or iron oxide 12.

Figure 1B:
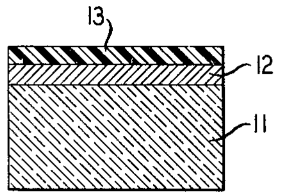
Figure 1C:
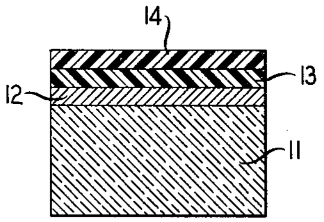

Following, a conventional photoresist 13 of the type alluded to above is deposited upon the assembly of FIG. 1A in a thickness ranging from 0.2 to 0.8 micrometer (FIG. 1B). Then, the liquid emulsion 14 is applied to the photoresist layer (FIG. 1C) in a thickness of approximately 1.0–3.0 micrometers by conventional repetitive spin coating techniques, a wetting agent being applied to the surface of the photoresist and spun off prior to each coating application. The resultant assembly is then dried and is now ready for exposure. Next, the photo emulsion layer of the resultant structure is exposed in a projection optical system in which the lenses have been corrected for light of 436 nanometers and developing effected by conventional methods for thin photographic emulsions to obtain a developed image. Next, the developed image is printed into the underlying photoresist by exposing the latter to light of 350 to 450 nanometers through the image and processing the photoresist by stripping the photo emulsion therefrom, developing the resist image and etching the pattern into the underlying chromium or iron oxide. Finally, the remaining photoresist is stripped from the structure so yielding the desired mask.

Examples of the present invention are set forth below. They are intended merely as illustrations and it is to be appreciated that the techniques described may be varied by one skilled in the art without departing from the spirit and scope of the invention.

EXAMPLE I

A plate obtained from commercial sources, comprising a 2" x 2" x 0.60" flat glass plate coated with 0.1 micrometer of chromium overcoated with 0.8 micrometer of a poly(isoprene) photoresist was employed as the substrate. The substrate member was coated with 1.0 micrometer of a commercially available liquid photographic emulsion having a mean grain diameter of 0.06 micrometer by spin coating three times at 1,000 r.p.m., a commercial wetting agent being applied and spun off prior to each coating. Then, the assembly was air dried in a clean hood for 20 minutes. Following, the dried plate was exposed to 0.1 millijoule per square centimeter of light having a wavelength of 436 nanometers and developed by conventional techniques. The resultant plate bearing the developed image was then air dried for 20 minutes and again exposed, this time to 120 millijoules per square centimeter of light having a wavelength of $320 \leq \lambda \leq 450$ nanometers. At this juncture, the photo emulsion was stripped by dipping in a 1:1 solution of hypochlorous acid and water and rinsed and a photoresist image developed by a 15-second spray development and a 15-second spray rinse using conventional developers and rinses. The resultant assembly was then baked at 120° C. for ten minutes and the desired pattern etched into the chromium utilizing a sodium hydroxide-potassium-ferrocyanide etch. Finally, the remaining photoresist was stripped, using a commercial photoresist stripping agent.

EXAMPLE II

The procedure of Example I is repeated with the exception that iron oxide is substituted for the chromium coating and dilute hydrochloric acid is employed as the etchant.

We claim:

1. A laminar photomask including a transparent substrate member having deposited thereon successively (a) a thin film of a material selected from the group consisting of chromium and iron oxide, said film ranging in thickness from 0.07 to 0.15 micrometer, (b) a thin film of a photoresist having a thickness ranging from 0.2 to 0.8 micrometer, and (c) a thin layer of a high resolution silver halide in gelatin photographic emulsion having a thickness ranging from 1 to 3 micrometers, a developed grain size less than 0.1 micrometer and yielding sufficient contrast on development after exposure to about 0.1 millijoule per square centimeter of light to control exposure of the underlying photoresist.

2. Photomask in accordance with claim 1 wherein said material comprises chromium.

3. Photomask in accordance with claim 1 wherein said material comprises iron oxide.

4. Photomask in accordance with claim 1 wherein said photoresist comprises poly(isoprene).

5. Photomask in accordance with claim 2 wherein said substrate member is glass.

References Cited

UNITED STATES PATENTS

| | | | |
|---|---|---|---|
| 3,245,793 | 4/1966 | Smith | 96—67 |
| 3,376,139 | 4/1968 | Giangualano | 96—36.2 |
| 3,392,020 | 7/1968 | Yutzy | 96—67 |
| 3,488,194 | 1/1970 | Lydick | 96—67 |
| 3,561,963 | 2/1971 | Kiba | 96—36.2 |

OTHER REFERENCES

IBM Technical Disclosure Bulletin, Boone and Nepela, vol. 12, No. 12, May 1970.

NORMAN G. TORCHIN, Primary Examiner

J. R. HIGHTOWER, Assistant Examiner

U.S. Cl. X.R.

96—38.3, 67